(12) United States Patent
Cheng

(10) Patent No.: US 11,217,321 B2
(45) Date of Patent: Jan. 4, 2022

(54) SHIFT REGISTER AND DRIVING METHOD, GATE DRIVING CIRCUIT, AND DISPLAY DEVICE

(71) Applicants: Hefei Xinsheng Optoelectronics Technology Co., Ltd., Hefei (CN); BOE TECHNOLOGY GROUP CO., LTD., Beijing (CN)

(72) Inventor: Xuelian Cheng, Beijing (CN)

(73) Assignees: Hefei Xinsheng Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/925,572

(22) Filed: Jul. 10, 2020

(65) Prior Publication Data

US 2021/0012847 A1    Jan. 14, 2021

(30) Foreign Application Priority Data

Jul. 11, 2019    (CN) .......................... 201910624284.4

(51) Int. Cl.
*G09G 3/20* (2006.01)
*G09G 3/36* (2006.01)
*G11C 19/28* (2006.01)

(52) U.S. Cl.
CPC ........... *G11C 19/28* (2013.01); *G09G 3/2092* (2013.01); *G09G 3/3677* (2013.01); *G09G 2310/0286* (2013.01)

(58) Field of Classification Search
CPC .. G09G 3/2092; G09G 3/3266; G09G 3/3674; G09G 2310/0286; G11C 19/28
See application file for complete search history.

(56) References Cited

U.S. PATENT DOCUMENTS

2018/0182300 A1* 6/2018 Chen ....................... G11C 19/28
2018/0190173 A1* 7/2018 Feng ........................ G09G 3/20

* cited by examiner

*Primary Examiner* — Xuemei Zheng
(74) *Attorney, Agent, or Firm* — Thomas | Horstemeyer, LLP

(57) ABSTRACT

A shift register includes an input circuit, a first output circuit, a second output circuit, a pull-down control circuit, a pull-down circuit, and a reset circuit. The shift register provided by the disclosure can drive two rows of gate lines.

20 Claims, 4 Drawing Sheets

SHIFT REGISTER AND DRIVING METHOD, GATE DRIVING CIRCUIT, AND DISPLAY DEVICE

CROSS-REFERENCE TO RELATED APPLICATION

This application is based upon, and claims the benefit of and priority to, Chinese Patent Application No. 201910624284.4, filed Jul. 11, 2019, the entire contents of which are incorporated herein by reference.

TECHNICAL FIELD

The present disclosure relates to the field of display technology and, more particularly, to a shift register and driving method, a gate driving circuit, and a display device.

BACKGROUND

In the field of display technology, a gate driving circuit is generally used to send a gate drive signal to pixels in a display area row by row, so that the pixels receive a data signal row by row. The gate driving circuit generally includes shift registers connected in cascade, and an output terminal of each shift register is connected to a row of the pixels for sending the above gate drive signal to the pixels.

However, in the related art, each shift register can only output the gate drive signal to a row of the pixels, resulting in a large number of the shift registers, thereby limiting the development of a narrow bezel of a display device.

It should be noted that the information disclosed in the background section above is only used to enhance the understanding of the background of the present disclosure, and therefore may include information that does not constitute the prior art known to those of ordinary skill in the art.

SUMMARY

An object of the present disclosure is providing a shift register and driving method, a gate driving circuit, and a display device.

Other features and advantages of the present disclosure will become apparent through the following detailed description, or partly learned through the practice of the present disclosure.

According to an aspect of the present disclosure, there is provided a shift register, which includes: an input circuit, a first output circuit, a second output circuit, a pull-down control circuit, a pull-down circuit, and a reset circuit. The input circuit is coupled to a first power signal terminal, a signal input terminal, and a pull-up node, and is configured to transmit a signal of the first power signal terminal to the pull-up node in response to a signal of the signal input terminal; the first output circuit is coupled to the pull-up node, a first clock signal terminal, a second clock signal terminal, a third clock signal terminal, a first node, a second node, and a first output terminal, and is configured to transmit a signal of the first clock signal terminal to the first node in response to a signal of the pull-up node, transmit a signal of the second clock signal terminal to the second node, and transmit a signal of the third clock signal terminal to the first output terminal; the second output circuit is coupled to the first output terminal, a pull-down node, a second output terminal, a compensation input terminal, and a second power signal terminal, and is configured to transmit a signal of the first output terminal to the second output terminal in response to the signal of the first output terminal, transmit a signal of the compensation input terminal to the second output terminal in response to the signal of the compensation input terminal, and transmit a signal of the second power signal terminal to the second output terminal in response to a signal of the pull-down node; the pull-down control circuit is coupled to the first power signal terminal, the pull-up node, the pull-down node, and the second power signal terminal, and is configured to transmit the signal of the second power signal terminal to the pull-down node in response to the signal of the pull-up node, and transmit the signal of the first power signal terminal to the pull-down node in response to the signal of the first power signal terminal; the pull-down circuit is coupled to the second power signal terminal, the pull-down node, the first node, the second node, the first output terminal, and the pull-up node, and is configured to transmit the signal of the second power signal terminal to the first node, the second node, the first output terminal, and the pull-up node in response to the signal of the pull-down node; and the reset circuit is coupled to the second power signal terminal, the pull-up node, and a reset signal terminal, and is configured to transmit the signal of the second power signal terminal to the pull-up node in response to a signal of the reset signal terminal.

In an exemplary embodiment of the present disclosure, the shift register further includes a general reset circuit, coupled to the second power signal terminal, the pull-up node, and a general reset signal terminal, and configured to transmit the signal of the second power signal terminal to the pull-up node in response to a signal of the general reset signal terminal.

In an exemplary embodiment of the present disclosure, the input circuit includes a first switching element, a first terminal of the first switching element is coupled to the first power signal terminal, and a second terminal thereof is coupled to the pull-up node, and a control terminal thereof is coupled to the signal input terminal.

In an exemplary embodiment of the present disclosure, the first output circuit includes: a second switching element, a third switching element, a fourth switching element, a first capacitor, and a second capacitor. A first terminal of the second switching element is coupled to the first clock signal terminal, a second terminal thereof is coupled to the first node, and a control terminal thereof is coupled to the pull-up node; a first terminal of the third switching element is coupled to the second clock signal terminal, a second terminal thereof is coupled to the second node, and a control terminal thereof is coupled to the pull-up node; a first terminal of the fourth switching element is coupled to the third clock signal terminal, a second terminal thereof is coupled to the first output terminal, a control terminal thereof is coupled to the pull-up node; the first capacitor is coupled between the second node and the control terminal of the third switching element; and the second capacitor is coupled between the first output terminal and the control terminal of the fourth switching element.

In an exemplary embodiment of the present disclosure, the second output circuit may include a fifth switching element, a sixth switching element, and a seventh switching element. A first terminal of the fifth switching element is coupled to the first output terminal, a control terminal thereof is coupled to the first output terminal, and a second terminal thereof is coupled to the second output terminal; a first terminal of the sixth switching element is coupled to the second output terminal, a second terminal thereof is coupled to the compensation input terminal, and a control terminal thereof is coupled to the compensation input terminal; a first terminal of the seventh switching element is coupled to the second power signal terminal, a second terminal thereof is coupled to the second output terminal, and a control terminal thereof is coupled to the pull-down node.

In an exemplary embodiment of the present disclosure, the pull-down control circuit includes an eighth switching element and a ninth switching element. A first terminal of the eighth switching element is coupled to the first power signal terminal, a control terminal thereof is coupled to the first power signal terminal, and a second terminal thereof is coupled to the pull-down node; a first terminal of the ninth switching element is coupled to the second power signal terminal, a second terminal thereof is coupled to the pull-down node, and a control terminal thereof is coupled to the pull-up node.

In an exemplary embodiment of the present disclosure, the pull-down circuit includes a tenth switching element, an eleventh switching element, a twelfth switching element, and a thirteenth switching element. A first terminal of the tenth switching element is coupled to the second power signal terminal, a second terminal thereof is coupled to the pull-up node, and a control terminal thereof is coupled to the pull-down node; a first terminal of the eleventh switching element is coupled to the second power signal terminal, a second terminal thereof is coupled to the first node, and a control terminal thereof is coupled to the pull-down node; a first terminal of the twelfth switching element is coupled to the second power signal terminal, a second terminal thereof is coupled to the second node, and a control terminal thereof is coupled to the pull-down node; and a first terminal of the thirteenth switching element is coupled to the second power signal terminal, a second terminal thereof is coupled to the first output terminal, and a control terminal thereof is coupled to the pull-down node.

In an exemplary embodiment of the present disclosure, the reset circuit includes a fourteenth switching element, a first terminal of the fourteenth switching element is coupled to the second power signal terminal, a second terminal thereof is coupled to the pull-up node, and a control terminal is coupled to the reset signal terminal.

In an exemplary embodiment of the present disclosure, the general reset circuit includes a fifteenth switching element, a first terminal of the fifteenth switching element is coupled to the second power signal terminal, a second terminal thereof is coupled to the pull-up node, and a control terminal thereof is coupled to the general reset signal terminal.

According to an aspect of the present disclosure, there is provided a driving method for a shift register for driving the above shift register, comprising: setting the signal of the first power signal terminal to a valid level signal, and setting the signal of the second power signal terminal to an invalid level signal;

during a first stage:

setting the signal of the signal input terminal to a valid level signal, and setting the signals of the first clock signal terminal, the second clock signal terminal, and the third clock signal terminal to invalid level signals, to transmit the valid level signal of the first power signal terminal to the pull-up node;

during a second stage:

setting the signals of first clock signal terminal and the third clock signal terminal to valid level signals, and setting the signals of the second clock signal terminal and the signal input terminal to invalid level signals, to transmit the valid level signal of the first clock signal terminal to the first node, transmit valid level signal of the third clock signal terminal to the first output terminal, and transmit the valid level of the first output terminal to the second output terminal;

during a third stage:

setting the signals of the first clock signal terminal, the second clock signal terminal, and the third clock signal terminal to valid level signals, to transmit the valid level signal of the first clock signal terminal to the first node, transmit the valid level of the second clock signal terminal to the second node, transmit the valid level signal of the third clock signal terminal to the first output terminal, and transmit the valid level of the first output terminal to the second output terminal;

during a fourth stage:

setting the signals of the first clock signal terminal and the third clock signal terminal to invalid level signals, and setting the signals of the second clock signal terminal and the compensation input terminal to valid level signals, to transmit the valid level of the second clock signal terminal to the second node, and transmit the valid level of the compensation input terminal to the second output terminal; and during a fifth stage, setting the signal of the reset signal terminal to the valid level signal, to set the signal of the pull-down node to the valid level signal, transmit the invalid level signal of the second power signal terminal to the second output terminal, and transmit the invalid level signal of the second power signal terminal to the first node, the second node, the pull-up node, and the first output terminal.

According to an aspect of the present disclosure, there is provided a gate driving circuit including the above shift register, wherein a plurality of the shift registers are connected in cascade, the plurality of the cascaded shift registers include adjacent previous stage shift registers and next stage shift registers;

the first nodes of the previous stage shift registers are coupled to the signal input terminals of the next stage shift registers;

the compensation input terminals of the previous stage shift registers are coupled to the first output terminals of the next stage shift registers; and the second nodes of the next stage shift registers are coupled to the reset signal terminals of the previous stage shift registers.

According to an aspect of the present disclosure, there is provided a display device including the above gate driving circuit, wherein the first output terminal and the second output terminal in the shift register are connected to two adjacent gate lines, respectively.

The present disclosure provides a shift register and driving method, a gate driving circuit, and a display device. The shift register includes: an input circuit, a first output circuit, a second output circuit, a pull-down control circuit, a pull-down circuit, and a reset circuit. When the shift register is driven, the signal of the first power signal terminal is set to a valid level signal, and the signal of the second power signal terminal is set to an invalid level signal;

during a first stage:

setting the signal of the signal input terminal to a valid level signal, and setting the signals of the first clock signal terminal, the second clock signal terminal, and the third clock signal terminal to invalid level signals, to transmit the valid level signal of the first power signal terminal to the pull-up node;

during a second stage:

setting the signals of first clock signal terminal and the third clock signal terminal to valid level signals, and setting the signals of the second clock signal terminal and the signal input terminal to invalid level signals, to transmit the valid level signal of the first clock signal terminal to the first node, transmit valid level signal of the third clock signal terminal to the first output terminal, and transmit the valid level of the first output terminal to the second output terminal;

during a third stage:

setting the signals of the first clock signal terminal, the second clock signal terminal, and the third clock signal terminal to valid level signals, to transmit the valid level signal of the first clock signal terminal to the first node, transmit the valid level of the second clock signal terminal to the second node, transmit the valid level signal of the third clock signal terminal to the first output terminal, and transmit the valid level of the first output terminal to the second output terminal;

during a fourth stage:

setting the signals of the first clock signal terminal and the third clock signal terminal to invalid level signals, and setting the signals of the second clock signal terminal and the compensation input terminal to valid level signals, to transmit the valid level of the second clock signal terminal to the second node, and transmit the valid level of the compensation input terminal to the second output terminal; and during a fifth stage, setting the signal of the reset signal terminal to the valid level signal, to set the signal of the pull-down node to the valid level signal, transmit the invalid level signal of the second power signal terminal to the second output terminal.

It is to be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the description. Understandably, the drawings in the following description are just some embodiments of the present disclosure. For those of ordinary skill in the art, other drawings may be obtained based on these drawings without creative effort.

DETAILED DESCRIPTION

Figure 1:
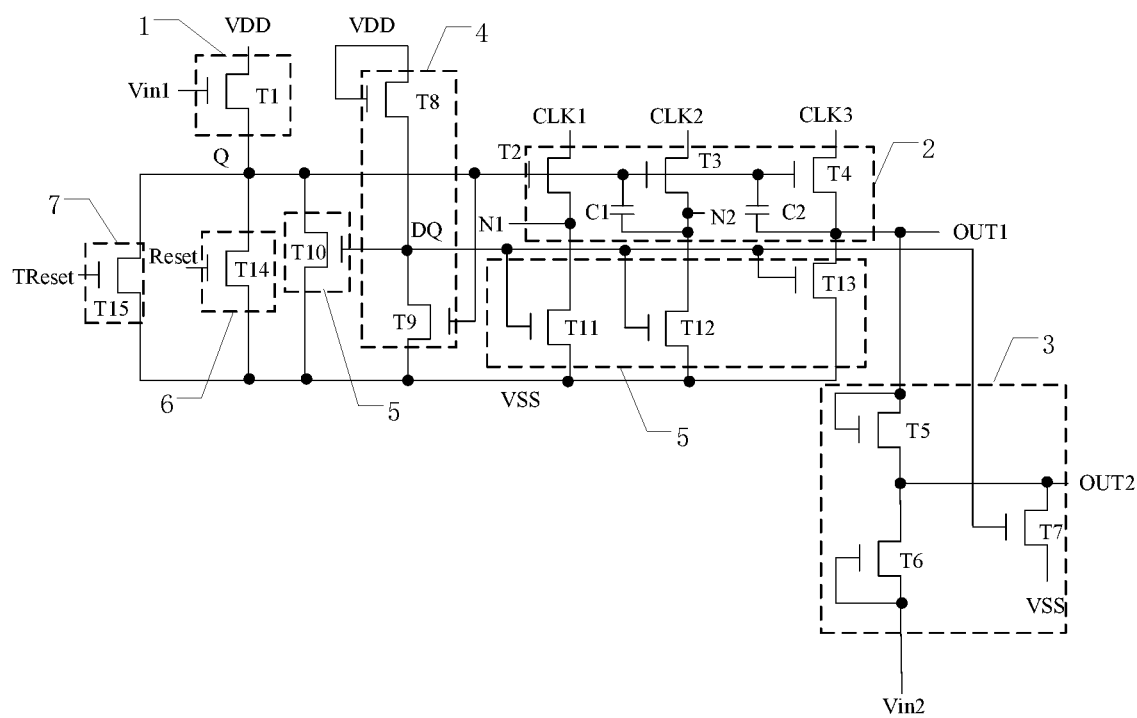
FIG. 1 is a schematic structural view of an exemplary embodiment of a shift register of the present disclosure.

Example embodiments will now be described more fully with reference to the accompanying drawings. However, the example embodiments can be implemented in various forms and should not be construed as limited to the embodiments set forth herein; rather, these embodiments are provided so that this disclosure will be thorough and complete, and will fully convey the concept of the example embodiments to those skilled in the art. The same reference numerals in the drawings denote the same or similar structures, and thus their detailed descriptions will be omitted.

Although relative terms such as "up" and "down" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below." Other relative terms, such as "high," "low," "top," "bottom," "left," "right," and the like, have similar meanings. When a structure is "on" other structure(s), it may mean that the structure is integrally formed on the other structure(s), or that the structure is "directly" arranged on the other structure(s), or that the structure is "indirectly" arranged on other structure(s) through another structure.

The terms "a," "an," "the," and "said" are used to indicate the presence of one or more elements, components, etc. The terms "comprising" and "including" are used to indicate open-ended inclusive, and means that there may be additional elements, components, etc., in addition to the listed elements, components, etc.

The present exemplary embodiment first provides a shift register, as shown in FIG. 1, which is a schematic structural view of an exemplary embodiment of the shift register of the present disclosure. The shift register includes: an input circuit 1, a first output circuit 2, a second output circuit 3, a pull-down control circuit 4, a pull-down circuit 5, and a reset circuit 6. The input circuit 1 is coupled to a first power signal terminal VDD, a signal input terminal Vin1, and a pull-up node Q, and is configured to transmit a signal of the first power signal terminal VDD to the pull-up node Q in response to a signal of the signal input terminal Vin1; the first output circuit 2 is coupled to the pull-up node Q, a first clock signal terminal CLK1, a second clock signal terminal CLK2, a third clock signal terminal CLK3, a first node N1, a second node N2, and a first output terminal OUT1, and is configured to transmit a signal of the first clock signal terminal CLK1 to the first node N1 in response to a signal of the pull-up node Q, transmit a signal of the second clock signal terminal CLK2 to the second node N2, and transmit a signal of the third clock signal terminal CLK3 to the first output terminal OUT1; the second output circuit is coupled to the first output terminal OUT1, a pull-down node DQ, a second output terminal OUT2, a compensation input terminal Vin2, and a second power signal terminal VSS, and is configured to transmit a signal of the first output terminal OUT1 to the second output terminal OUT2 in response to the signal of the first output terminal OUT1, transmit a signal of the compensation input terminal to the second output terminal OUT2 in response to the signal of the compensation input terminal, and transmit a signal of the second power signal terminal VSS to the second output terminal OUT2 in response to a signal of the pull-down node DQ; the pull-down control circuit is coupled to the first power signal terminal VDD, the pull-up node Q, the pull-down node DQ, and the second power signal terminal VSS, and is configured to transmit the signal of the second power signal terminal VSS to the pull-down node DQ in response to the signal of the pull-up node Q, and transmit the signal of the first power signal terminal VDD to the pull-down node DQ in response to the signal of the first power signal terminal VDD; the pull-down circuit is coupled to the second power signal terminal VSS, the pull-down node DQ, the first node N1, the second node N2, the first output terminal OUT1, and the pull-up node Q, and is configured to transmit the signal of the second power signal terminal VSS to the first node N1, the second node N2, the first output terminal OUT1, and the pull-up node Q in response to the signal of the pull-down node DQ; and the reset circuit is coupled to the second power signal terminal VSS, the pull-up node Q, and a reset signal terminal, and is configured to transmit the signal of the second power signal terminal VSS to the pull-up node Q in response to a signal of the reset signal terminal.

The exemplary embodiment provides a driving method for the shift register, and the shift register includes: the input circuit, the first output circuit, the second output circuit, the pull-down control circuit, the pull-down circuit, and the reset circuit. When the shift register is driven, the signal of the first power signal terminal VDD is set to a valid level signal, and the signal of the second power signal terminal VSS is set to an invalid level signal. In an embodiment, the driving method for the shift register includes following stages.

During a First Stage:
Setting the signal of the signal input terminal Vin1 to a valid level signal, and setting the signals of the first clock signal terminal CLK1, the second clock signal terminal CLK2, and the third clock signal terminal CLK3 to invalid level signals, to transmit the valid level signal of the first power signal terminal VDD to the pull-up node Q;

During a Second Stage:
Setting the signals of first clock signal terminal CLK1 and the third clock signal terminal CLK3 to valid level signals, and setting the signals of the second clock signal terminal CLK2 and the signal input terminal to invalid level signals, to transmit the valid level signal of the first clock signal terminal CLK1 to the first node N1, transmit valid level signal of the third clock signal terminal CLK3 to the first output terminal OUT1, and transmit the valid level of the first output terminal OUT1 to the second output terminal OUT2;

During a Third Stage:
Setting the signals of the first clock signal terminal CLK1, the second clock signal terminal, and the third clock signal terminal CLK3 to valid level signals, to transmit the valid level signal of the first clock signal terminal CLK1 to the first node N1, transmit the valid level of the second clock signal terminal CLK2 to the second node N2, transmit the valid level signal of the third clock signal terminal CLK3 to the first output terminal OUT1, and transmit the valid level of the first output terminal OUT1 to the second output terminal OUT2;

During a Fourth Stage:
Setting the signals of the first clock signal terminal CLK1 and the third clock signal terminal CLK3 to invalid level signals, and setting the signals of the second clock signal terminal CLK2 and the compensation input terminal to valid level signals, to transmit the valid level of the second clock signal terminal CLK2 to the second node N2, and transmit the valid level of the compensation input terminal to the second output terminal OUT2; and During a fifth stage, setting the signal of the reset signal terminal to the valid level signal, to set the signal of the pull-down node DQ to the valid level signal, transmit the invalid level signal of the second power signal terminal VSS to the second output terminal OUT2, and transmit the invalid level signal of the second power signal terminal to the first node, the second node, the pull-up node, and the first output terminal.

In the shift register provided by the present disclosure, during the second and third stages, the valid level signal output from the first output terminal OUT1 may be used to drive a row of pixels; and during the second, third and fourth stages, the valid level signal output from the second output terminal OUT2 may be used to drive another row of pixels. In the shift register, during the second and third stages, the valid level signal output by the first output terminal OUT1 may be used as the signal of the compensation input terminal of the previous stage shift register, and the valid level signal of the first node N1 may be used as the signal of the signal input terminal of the next stage shift register; and in the shift register, during the third and fourth stages, the valid level signal on the second node N2 may be used as the signal of reset signal terminal of the previous stage shift register. On one hand, the shift register provided by the present disclosure may drive two rows of pixels, thereby simplifying the gate driving circuit of the display device and reducing the bezel width of the display device; on the other hand, the second output terminal OUT2 may be charged in the shift register during the second stage, which increases the charging time, thereby canceling the upper edge loss when the second output terminal OUT2 is charged.

In the exemplary embodiment, as shown in FIG. 1, the shift register may further include a general reset circuit 7 that is coupled to the second power signal terminal VSS, the pull-up node Q, and a general reset signal terminal TReset, and is configured to transmit the signal of the second power signal terminal VSS to the pull-up node Q in response to a signal of the general reset signal terminal TReset. The general reset circuit 7 may reset the shift register before the start of each frame of the display device.

In the exemplary embodiment, as shown in FIG. 1, the input circuit 1 may include a first switching element T1, a first terminal of the first switching element T1 is coupled to the first power signal terminal VDD, and a second terminal thereof is coupled to the pull-up node Q, and a control terminal thereof is coupled to the signal input terminal Vin1. It should be understood that, in other exemplary embodiments, the input circuit may further have more optional structures, which all fall within the scope of the present disclosure.

In the exemplary embodiment, as shown in FIG. 1, the first output circuit may include a second switching element T2, a third switching element T3, a fourth switching element T4, a first capacitor C1, and a second capacitor C2. A first terminal of the second switching element T2 is coupled to the first clock signal terminal CLK1, a second terminal thereof is coupled to the first node N1, and a control terminal thereof is coupled to the pull-up node Q; a first terminal of the third switching element T3 is coupled to the second clock signal terminal CLK2, a second terminal thereof is coupled to the second node N2, and a control terminal thereof is coupled to the pull-up node Q; a first terminal of the fourth switching element T4 is coupled to the third clock signal terminal CLK3, a second terminal thereof is coupled to the first output terminal OUT1, a control terminal thereof is coupled to the pull-up node Q; the first capacitor is coupled between the second node N2 and the control terminal of the third switching element T3; and the second capacitor is coupled between the first output terminal OUT1 and the control terminal of the fourth switching element T4. It should be understood that, in other exemplary embodiments, the first output circuit may further have more optional structures, which all fall within the scope of the present disclosure.

In the exemplary embodiment, as shown in FIG. 1, the second output circuit may include a fifth switching element T5, a sixth switching element T6, and a seventh switching element T7. A first terminal of the fifth switching element is coupled to the first output terminal OUT1, a control terminal thereof is coupled to the first output terminal OUT1, and a second terminal thereof is coupled to the second output terminal OUT2; a first terminal of the sixth switching element is coupled to the second output terminal OUT2, a second terminal thereof is coupled to the compensation input terminal, and a control terminal thereof is coupled to the compensation input terminal; a first terminal of the seventh switching element is coupled to the second power signal terminal VSS, a second terminal thereof is coupled to the second output terminal OUT2, and a control terminal thereof is coupled to the pull-down node DQ. It should be understood that, in other exemplary embodiments, the second output circuit may further have more optional structures, which all fall within the scope of the present disclosure.

In the exemplary embodiment, as shown in FIG. 1, the pull-down control circuit includes an eighth switching element T8 and a ninth switching element T9. A first terminal of the eighth switching element is coupled to the first power signal terminal VDD, a control terminal thereof is coupled to the first power signal terminal VDD, and a second terminal thereof is coupled to the pull-down node DQ; a first terminal of the ninth switching element is coupled to the second power signal terminal VSS, a second terminal thereof is coupled to the pull-down node DQ, and a control terminal thereof is coupled to the pull-up node Q. It should be understood that, in other exemplary embodiments, the pull-down control circuit may further have more optional structures, which all fall within the scope of the present disclosure.

In the exemplary embodiment, as shown in FIG. 1, the pull-down circuit may include a tenth switching element T10, an eleventh switching element T11, a twelfth switching element T12, and a thirteenth switching element T13. A first terminal of the tenth switching element is coupled to the second power signal terminal VSS, a second terminal thereof is coupled to the pull-up node Q, and a control terminal thereof is coupled to the pull-down node DQ; a first terminal of the eleventh switching element is coupled to the second power signal terminal VSS, a second terminal thereof is coupled to the first node N1, and a control terminal thereof is coupled to the pull-down node DQ; a first terminal of the twelfth switching element is coupled to the second power signal terminal VSS, a second terminal thereof is coupled to the second node N2, and a control terminal thereof is coupled to the pull-down node DQ; and a first terminal of the thirteenth switching element is coupled to the second power signal terminal VSS, a second terminal thereof is coupled to the first output terminal OUT1, and a control terminal thereof is coupled to the pull-down node DQ. It should be understood that, in other exemplary embodiments, the pull-down circuit may further have more optional structures, which all fall within the scope of the present disclosure.

In the exemplary embodiment, as shown in FIG. 1, the reset circuit may include a fourteenth switching element T14, a first terminal of the fourteenth switching element is coupled to the second power signal terminal VSS, a second terminal thereof is coupled to the pull-up node Q, and a control terminal is coupled to the reset signal terminal Reset. It should be understood that, in other exemplary embodiments, the reset circuit may further have more optional structures, which all fall within the scope of the present disclosure.

In the exemplary embodiment, as shown in FIG. 1, the general reset circuit may include a fifteenth switching element T15, a first terminal of the fifteenth switching element is coupled to the second power signal terminal VSS, a second terminal thereof is coupled to the pull-up node Q, and a control terminal thereof is coupled to the general reset signal terminal TReset. It should be understood that, in other exemplary embodiments, the general reset circuit may further have more optional structures, which all fall within the scope of the present disclosure.

In the exemplary embodiment, the first to fifteenth switching elements may be N-type switching transistors or P-type switching transistors; and the valid level signal output by the shift register may be a high level or low level. In the exemplary embodiment, the operation timing of the shift register is described by taking the first to fifteenth switching elements being N-type switching transistors, and the valid level signal output by the shift register being a high level as an example. Correspondingly, the signal of the first power signal terminal is continuously at a high level, and the signal of the second power signal terminal is continuously at a low level.

Figure 2:
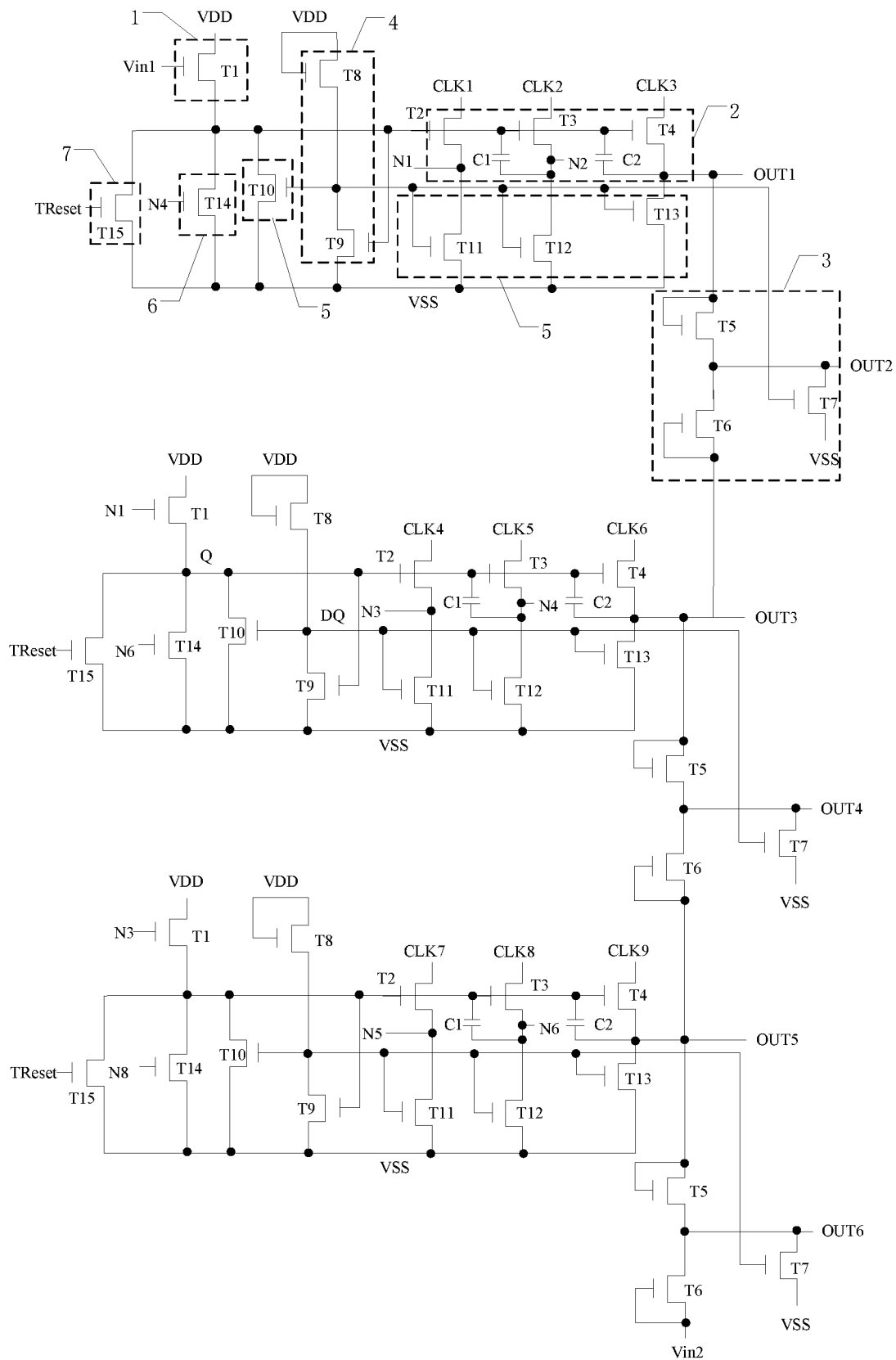
FIG. 2 is a cascade diagram in an exemplary embodiment of a shift register of the present disclosure.
Figure 3:
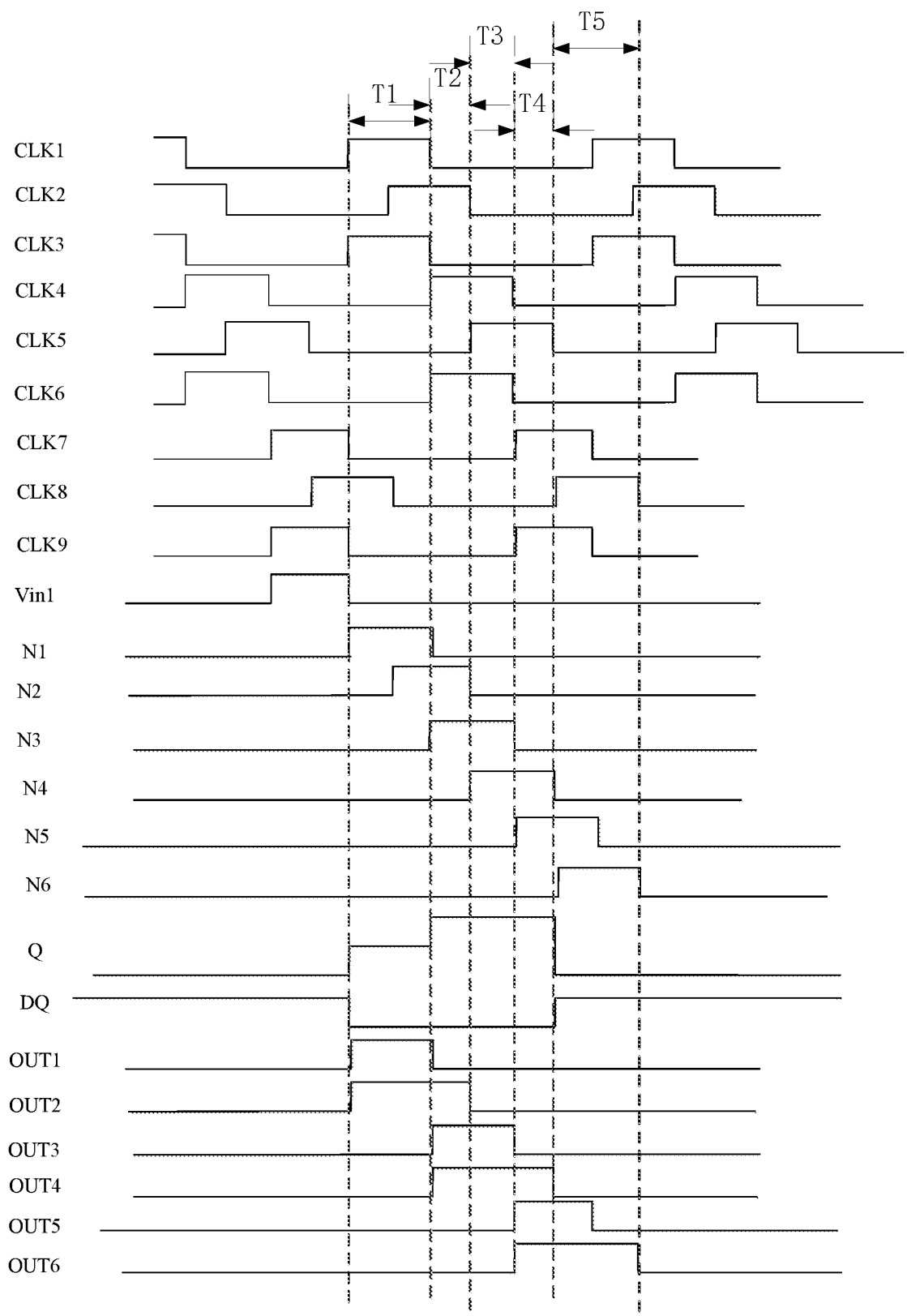
FIG. 3 is a timing diagram of respective nodes in an exemplary embodiment of a shift register of the present disclosure.

FIGS. 2 and 3 are shown, where FIG. 2 is a cascade diagram in an exemplary embodiment of a shift register of the present disclosure, and FIG. 3 is a timing diagram of respective nodes in an exemplary embodiment of a shift register of the present disclosure. FIG. 2 is a cascade diagram of a first-stage shift register, a second-stage shift register, and a third-stage shift register. In FIG. 3, CLK1, 2, and 3 are the timing of a first clock signal terminal, a second clock signal terminal, and a third clock signal terminal in the first-stage shift register, respectively; CLK4, 5, and 6 are the timing of a first clock signal terminal, a second clock signal terminal, and a third clock signal terminal in the second-stage shift register, respectively; and CLK7, 8, and 9 are the timing of a first clock signal terminal, a second clock signal terminal, and a third clock signal terminal in the third-stage shift register, respectively. Q is the timing of the pull-up node in the second-stage shift register, and DQ is the timing of the pull-down node in the second-stage shift register. OUT1 and OUT2 are the timing of the first output terminal and second output terminal of the first-stage shift register, respectively; OUT3 and OUT4 are the timing of the first output terminal and second output terminal of the second-stage shift register, respectively; and OUT5 and OUT6 are the timing of the first output terminal and second output terminal of the third-stage shift register, respectively. N1 and N2 are the timing of the first node and the second node of the first-stage shift register, respectively. N3 and N4 are the timing of the first node and the second node of the second-stage shift register, respectively. N5 and N6 are the timing of the first node and the second node of the third-stage shift register, respectively. The first node N1 of the first-stage shift register may be used as the signal input terminal of the second-stage shift register, and the first output terminal OUT5 of the third-stage shift register may be used as the compensation input terminal of the second-stage shift register, the second node N6 of the third-stage shift register may be used as the reset signal terminal of the second-stage shift register, and the second node N4 of the second-stage shift register may be used as the reset signal terminal of the first-stage shift register. The exemplary embodiment is described by taking the second-stage shift register as an example. As shown in FIG. 3, the operation of the second-stage shift register is divided into five stages.

During the First Phase T1:

The signal of the signal input terminal N1 of the second-stage shift register is a high-level signal, and the signals of the first clock signal terminal CLK4, the second clock signal terminal CLK5, and the third clock signal terminal CLK6 are low-level signals, the first switching element T1 is turned on to transmit the high-level signal of the first power signal terminal VDD to the pull-up node Q, while the ninth switching element is turned on to transmit the low-level signal of the second power signal terminal to the pull-down node DQ;

During the Second Phase T2:

The signals of the first clock signal terminal CLK4 and the third clock signal terminal CLK6 are high level signals, the signals of the second clock signal terminal CLK5 and the signal input terminal N1 are low level signals, the second switching element T2 is turned on to transmit the high-level signal of the first clock signal terminal CLK4 is to the first node N3, the fourth switching element T4 is turned on to transmit the high-level signal of the third clock signal terminal CLK6 to the first output terminal OUT3, and the fifth switching element T5 is turned on to transmit the valid level of the first output terminal OUT3 to the second output terminal OUT4;

During the Third Phase T3:

The signals of the first clock signal terminal CLK4, the second clock signal CLK5, and the third clock signal terminal CLK6 are high-level signals, and the second switching element T2 is turned on to transmit the high-level signal of the first clock signal terminal CLK4 to the first node N3, the third switching element T3 is turned on to transmit the valid level of the second clock signal terminal CLK5 to the second node N4, the fourth switching element T4 is turned on to transmit the high level signal of the third clock signal terminal CLK6 to the first output terminal OUT3, and the fifth switching element T5 is turned on to transmit the valid level of the first output terminal OUT3 to the second output terminal OUT4;

During the Fourth Phase T4:

The signals of the first clock signal terminal CLK4 and the third clock signal terminal CLK6 are low-level signals, the signals of the second clock signal terminal CLK5 and the compensation input terminal OUT5 are high-level signals, the third switching element T3 is turned on to transmit the valid level of the second clock signal terminal CLK5 to the second node N4, and the sixth switching element T6 is turned on to transmit the valid level of the compensation input terminal to the second output terminal OUT2; and During the fifth stage (T5): the signal of the reset signal terminal N6 is a high-level signal, the fourteenth opening element T14 is turned on to set the signal of the pull-down node DQ to a high-level signal, and the seventh switching element T7 is turned on to transmit the low-level signal of the second power supply signal terminal VSS to the second output terminal OUT4.

At the same time, the eleventh switching element, the twelfth switching element, the tenth switching element, and the thirteenth switching element are turned on to set the first node N3, the second node N4, the pull-up node Q, and the first output terminal OUT3 to a low level.

By analogy, the gate driving circuit composed of the shift registers may realize the effect of sending the gate drive signal row by row.

Figure 4:
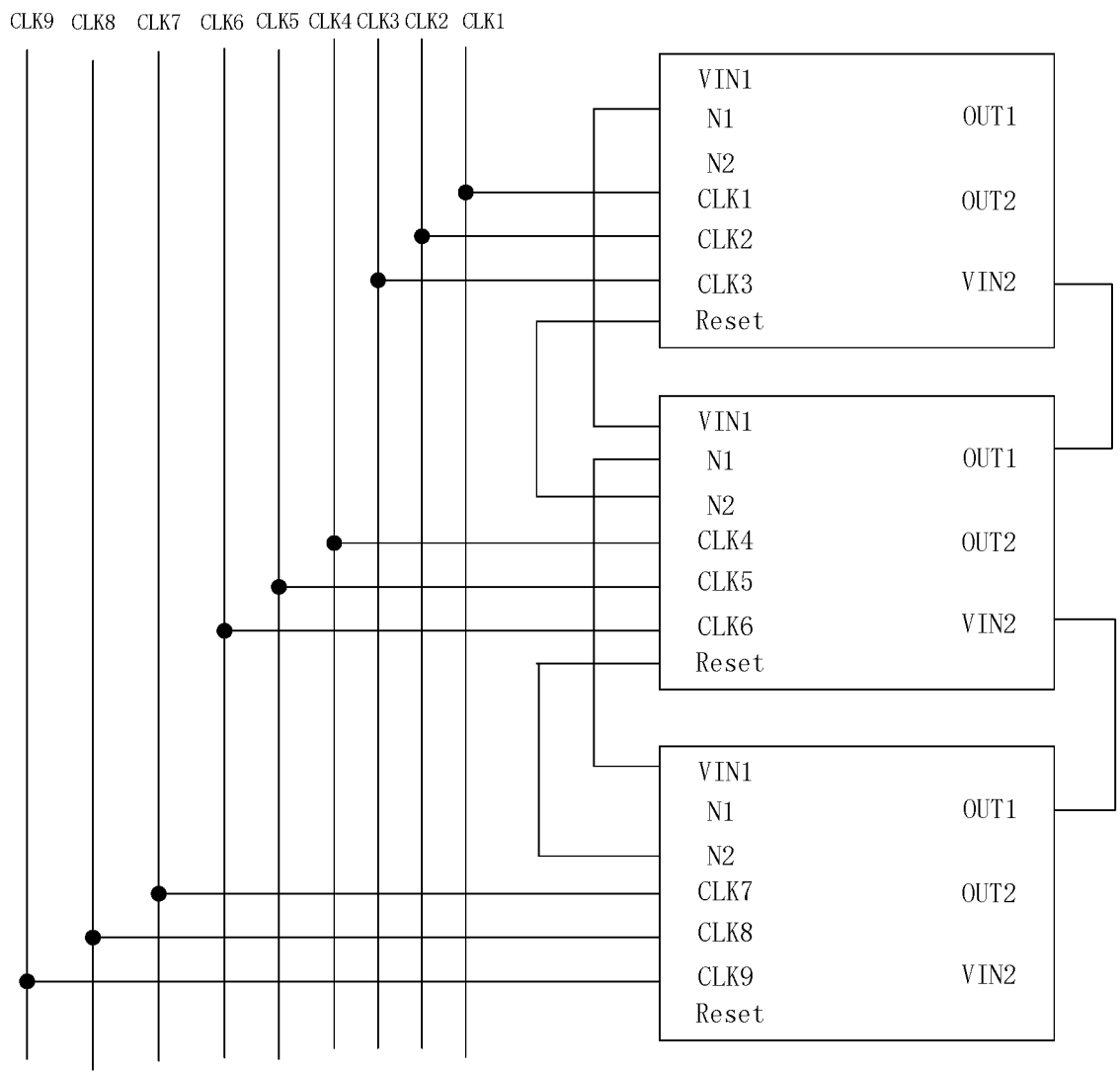
FIG. 4 is a schematic structural view of an exemplary embodiment of a gate driving circuit of the present disclosure.

The present exemplary embodiment further provides a gate driving circuit, as shown in FIG. 4, which is a schematic structural view of an exemplary embodiment of a gate driving circuit of the present disclosure. The gate driving circuit includes the above shift registers, where a plurality of the shift registers are connected in cascade, the plurality of the cascaded shift registers include adjacent previous stage shift registers and next stage shift registers;

the first nodes of the previous stage shift registers are coupled to the signal input terminals of the next stage shift registers;

the compensation input terminals of the previous stage shift registers are coupled to the first output terminals of the next stage shift registers; and the second nodes of the next stage shift registers are coupled to the reset signal terminals of the previous stage shift registers.

As shown in FIG. 4, the gate driving circuit may include first to ninth clock signal lines CLK1-9, where the timing of the first to ninth clock signal lines CLK1-9 is shown as CLK1-9 in FIG. 3. The (3n+1)-stage shift registers may share the clock signal lines CLK1-3, the (3n+2)-stage shift registers may share the clock signal lines CLK4-6, the (3n+3)-stage shift registers may share the clock signal lines CLK7-9, and n is a positive number.

The gate driving circuit provided by the disclosure has the same technical features and working principles as the above shift register. The above has been described in detail, and will not be repeated herein.

The present exemplary embodiment further provides a display device, which includes the above gate driving circuit, where the first output terminal and the second output terminal in the shift register are connected to two adjacent gate lines, respectively.

The display device provided by the exemplary embodiment has the same technical features and working principles as the above-described gate driving circuit, which has been described in detail, and will not be repeated herein.

Those skilled in the art will readily contemplate other embodiments of the present disclosure after considering the specification and practicing the disclosure disclosed herein. This application is intended to cover any variations, uses, or adaptations of the present disclosure that conform to the general principles of the disclosure and include the common general knowledge or conventional technical means in the technical field not disclosed by the disclosure. It is intended that the specification and examples be considered as exemplary only, with a true scope and spirit of the disclosure being indicated by the claims.

It should be understood that the present disclosure is not limited to the precise structure that has been described above and shown in the drawings, and various modifications and changes can be made without departing from the scope thereof. The scope of the present disclosure is limited only by the appended claims.

What is claimed is:

1. A shift register, comprising:
an input circuit coupled to a first power signal terminal, a signal input terminal, and a pull-up node, and configured to transmit a signal of the first power signal terminal to the pull-up node in response to a signal of the signal input terminal;
a first output circuit coupled to the pull-up node, a first clock signal terminal, a second clock signal terminal, a third clock signal terminal, a first node, a second node, and a first output terminal, and configured to, in response to a signal of the pull-up node, transmit a signal of the first clock signal terminal to the first node, transmit a signal of the second clock signal terminal to the second node, and transmit a signal of the third clock signal terminal to the first output terminal;
a second output circuit coupled to the first output terminal, a pull-down node, a second output terminal, a compensation input terminal coupled to a first output terminal of a next stage of shift register, and a second power signal terminal, and configured to transmit a signal of the first output terminal to the second output terminal in response to the signal of the first output terminal, transmit a signal of the compensation input terminal to the second output terminal in response to the signal of the compensation input terminal, and transmit a signal of the second power signal terminal to the second output terminal in response to a signal of the pull-down node;
a pull-down control circuit coupled to the first power signal terminal, the pull-up node, the pull-down node, and the second power signal terminal, and configured to transmit the signal of the second power signal terminal to the pull-down node in response to the signal of the pull-up node, and transmit the signal of the first power signal terminal to the pull-down node in response to the signal of the first power signal terminal;
a pull-down circuit coupled to the second power signal terminal, the pull-down node, the first node, the second node, the first output terminal, and the pull-up node, and configured to transmit the signal of the second power signal terminal to the first node, the second node, the first output terminal, and the pull-up node in response to the signal of the pull-down node; and
a reset circuit coupled to the second power signal terminal, the pull-up node, and a reset signal terminal, and configured to transmit the signal of the second power signal terminal to the pull-up node in response to a signal of the reset signal terminal.

2. The shift register according to claim 1, further comprising a general reset circuit coupled to the second power signal terminal, the pull-up node, and a general reset signal terminal, and configured to transmit the signal of the second power signal terminal to the pull-up node in response to a signal of the general reset signal terminal.

3. The shift register according to claim 2, wherein the general reset circuit comprises a fifteenth switching element having a first terminal coupled to the second power signal terminal, a second terminal coupled to the pull-up node, and a control terminal coupled to the general reset signal terminal.

4. The shift register according to claim 1, wherein the input circuit comprises a first switching element having a first terminal coupled to the first power signal terminal, a second terminal coupled to the pull-up node, and a control terminal coupled to the signal input terminal.

5. The shift register according to claim 1, wherein the first output circuit comprises:
a second switching element having a first terminal coupled to the first clock signal terminal, a second terminal coupled to the first node, and a control terminal coupled to the pull-up node;
a third switching element having a first terminal coupled to the second clock signal terminal, a second terminal coupled to the second node, and a control terminal coupled to the pull-up node;
a fourth switching element having a first terminal coupled to the third clock signal terminal, a second terminal coupled to the first output terminal, a control terminal coupled to the pull-up node;

a first capacitor coupled between the second node and the control terminal of the third switching element; and
a second capacitor coupled between the first output terminal and the control terminal of the fourth switching element.

6. The shift register according to claim 1, wherein the second output circuit comprises:
a fifth switching element having a first terminal coupled to the first output terminal, a control terminal coupled to the first output terminal, and a second terminal coupled to the second output terminal;
a sixth switching element having a first terminal coupled to the second output terminal, a second terminal coupled to the compensation input terminal, and a control terminal coupled to the compensation input terminal; and
a seventh switching element having a first terminal coupled to the second power signal terminal, a second terminal coupled to the second output terminal, and a control terminal coupled to the pull-down node.

7. The shift register according to claim 1, wherein the pull-down control circuit comprises:
an eighth switching element having a first terminal coupled to the first power signal terminal, a control terminal coupled to the first power signal terminal, and a second terminal coupled to the pull-down node; and
a ninth switching element having a first terminal coupled to the second power signal terminal, a second terminal coupled to the pull-down node, and a control terminal coupled to the pull-up node.

8. The shift register according to claim 1, wherein the pull-down circuit comprises:
a tenth switching element having a first terminal coupled to the second power signal terminal, a second terminal coupled to the pull-up node, and a control terminal coupled to the pull-down node;
an eleventh switching element having a first terminal coupled to the second power signal terminal, a second terminal coupled to the first node, and a control terminal coupled to the pull-down node;
a twelfth switching element having a first terminal coupled to the second power signal terminal, a second terminal coupled to the second node, and a control terminal coupled to the pull-down node; and
a thirteenth switching element having a first terminal coupled to the second power signal terminal, a second terminal coupled to the first output terminal, and a control terminal coupled to the pull-down node.

9. The shift register according to claim 1, wherein the reset circuit comprises a fourteenth switching element having a first terminal coupled to the second power signal terminal, a second terminal coupled to the pull-up node, and a control terminal coupled to the reset signal terminal.

10. A driving method for driving a shift register, comprising:
providing the shift register, the shift register comprising:
an input circuit coupled to a first power signal terminal, a signal input terminal, and a pull-up node, and configured to transmit a signal of the first power signal terminal to the pull-up node in response to a signal of the signal input terminal;
a first output circuit coupled to the pull-up node, a first clock signal terminal, a second clock signal terminal, a third clock signal terminal, a first node, a second node, and a first output terminal, and configured to, in response to a signal of the pull-up node, transmit a signal of the first clock signal terminal to the first node, transmit a signal of the second clock signal terminal to the second node, and transmit a signal of the third clock signal terminal to the first output terminal;
a second output circuit coupled to the first output terminal, a pull-down node, a second output terminal, a compensation input terminal coupled to a first output terminal of a next stage of shift register, and a second power signal terminal, and configured to, transmit a signal of the first output terminal to the second output terminal in response to the signal of the first output terminal, transmit a signal of the compensation input terminal to the second output terminal in response to the signal of the compensation input terminal, and transmit a signal of the second power signal terminal to the second output terminal in response to a signal of the pull-down node;
a pull-down control circuit coupled to the first power signal terminal, the pull-up node, the pull-down node, and the second power signal terminal, and configured to transmit the signal of the second power signal terminal to the pull-down node in response to the signal of the pull-up node, and transmit the signal of the first power signal terminal to the pull-down node in response to the signal of the first power signal terminal;
a pull-down circuit coupled to the second power signal terminal, the pull-down node, the first node, the second node, the first output terminal, and the pull-up node, and configured to transmit the signal of the second power signal terminal to the first node, the second node, the first output terminal, and the pull-up node in response to the signal of the pull-down node; and
a reset circuit coupled to the second power signal terminal, the pull-up node, and a reset signal terminal, and configured to transmit the signal of the second power signal terminal to the pull-up node in response to a signal of the reset signal terminal;
setting the signal of the first power signal terminal to a valid level signal, and setting the signal of the second power signal terminal to an invalid level signal;
setting the signal of the signal input terminal to a valid level signal, and setting the signals of the first clock signal terminal, the second clock signal terminal, and the third clock signal terminal to invalid level signals, to transmit the valid level signal of the first power signal terminal to the pull-up node;
setting the signals of first clock signal terminal and the third clock signal terminal to valid level signals, and setting the signals of the second clock signal terminal and the signal input terminal to invalid level signals, to transmit the valid level signal of the first clock signal terminal to the first node, transmit valid level signal of the third clock signal terminal to the first output terminal, and transmit the valid level of the first output terminal to the second output terminal;
setting the signals of the first clock signal terminal, the second clock signal terminal, and the third clock signal terminal to valid level signals, to transmit the valid level signal of the first clock signal terminal to the first node, transmit the valid level of the second clock signal terminal to the second node, transmit the valid level signal of the third clock signal terminal to the first output terminal, and transmit the valid level of the first output terminal to the second output terminal;

setting the signals of the first clock signal terminal and the third clock signal terminal to invalid level signals, and setting the signals of the second clock signal terminal and the compensation input terminal to valid level signals, to transmit the valid level of the second clock signal terminal to the second node, and transmit the valid level of the compensation input terminal to the second output terminal; and
setting the signal of the reset signal terminal to the valid level signal, to set the signal of the pull-down node to the valid level signal, transmit the invalid level signal of the second power signal terminal to the second output terminal, and transmit the invalid level signal of the second power signal terminal to the first node, the second node, the pull-up node, and the first output terminal.

11. A gate driving circuit comprising a shift register, the shift register comprising:
an input circuit coupled to a first power signal terminal, a signal input terminal, and a pull-up node, and configured to transmit a signal of the first power signal terminal to the pull-up node in response to a signal of the signal input terminal;
a first output circuit coupled to the pull-up node, a first clock signal terminal, a second clock signal terminal, a third clock signal terminal, a first node, a second node, and a first output terminal, and configured to, in response to a signal of the pull-up node, transmit a signal of the first clock signal terminal to the first node, transmit a signal of the second clock signal terminal to the second node, and transmit a signal of the third clock signal terminal to the first output terminal;
a second output circuit coupled to the first output terminal, a pull-down node, a second output terminal, a compensation input terminal, and a second power signal terminal, and configured to, transmit a signal of the first output terminal to the second output terminal in response to the signal of the first output terminal, transmit a signal of the compensation input terminal to the second output terminal in response to the signal of the compensation input terminal, and transmit a signal of the second power signal terminal to the second output terminal in response to a signal of the pull-down node;
a pull-down control circuit coupled to the first power signal terminal, the pull-up node, the pull-down node, and the second power signal terminal, and configured to transmit the signal of the second power signal terminal to the pull-down node in response to the signal of the pull-up node, and transmit the signal of the first power signal terminal to the pull-down node in response to the signal of the first power signal terminal;
a pull-down circuit coupled to the second power signal terminal, the pull-down node, the first node, the second node, the first output terminal, and the pull-up node, and configured to transmit the signal of the second power signal terminal to the first node, the second node, the first output terminal, and the pull-up node in response to the signal of the pull-down node; and
a reset circuit coupled to the second power signal terminal, the pull-up node, and a reset signal terminal, and configured to transmit the signal of the second power signal terminal to the pull-up node in response to a signal of the reset signal terminal, wherein:
a plurality of the shift registers are connected in cascade, wherein the plurality of the shift registers connected in cascade comprise adjacent previous stage shift registers and next stage shift registers;

the first nodes of the previous stage shift registers are coupled to the signal input terminals of the next stage shift registers;

the compensation input terminals of the previous stage shift registers are coupled to the first output terminals of the next stage shift registers; and the second nodes of the next stage shift registers are coupled to the reset signal terminals of the previous stage shift registers.

12. The gate driving circuit according to claim 11, wherein the shift register further comprises a general reset circuit coupled to the second power signal terminal, the pull-up node, and a general reset signal terminal, and configured to transmit the signal of the second power signal terminal to the pull-up node in response to a signal of the general reset signal terminal.

13. The gate driving circuit according to claim 12, wherein the general reset circuit comprises a fifteenth switching element having a first terminal coupled to the second power signal terminal, a second terminal coupled to the pull-up node, and a control terminal coupled to the general reset signal terminal.

14. The gate driving circuit according to claim 11, wherein the input circuit comprises a first switching element having a first terminal coupled to the first power signal terminal, and a second terminal coupled to the pull-up node, and a control terminal coupled to the signal input terminal.

15. The gate driving circuit according to claim 11, wherein the first output circuit comprises:

a second switching element having a first terminal coupled to the first clock signal terminal, a second terminal coupled to the first node, and a control terminal coupled to the pull-up node;

a third switching element having a first terminal coupled to the second clock signal terminal, a second terminal coupled to the second node, and a control terminal coupled to the pull-up node;

a fourth switching element having a first terminal coupled to the third clock signal terminal, a second terminal coupled to the first output terminal, a control terminal coupled to the pull-up node;

a first capacitor coupled between the second node and the control terminal of the third switching element; and a second capacitor coupled between the first output terminal and the control terminal of the fourth switching element.

16. The gate driving circuit according to claim 11, wherein the second output circuit comprises:

a fifth switching element having a first terminal coupled to the first output terminal, a control terminal coupled to the first output terminal, and a second terminal coupled to the second output terminal;

a sixth switching element having a first terminal coupled to the second output terminal, a second terminal coupled to the compensation input terminal, and a control terminal coupled to the compensation input terminal; and a seventh switching element having a first terminal coupled to the second power signal terminal, a second terminal coupled to the second output terminal, and a control terminal coupled to the pull-down node.

17. The gate driving circuit according to claim 11, wherein the pull-down control circuit comprises:

an eighth switching element having a first terminal coupled to the first power signal terminal, a control terminal coupled to the first power signal terminal, and a second terminal coupled to the pull-down node; and a ninth switching element having a first terminal coupled to the second power signal terminal, a second terminal coupled to the pull-down node, and a control terminal coupled to the pull-up node.

18. The gate driving circuit according to claim 11, wherein the pull-down circuit comprises:

a tenth switching element having a first terminal coupled to the second power signal terminal, a second terminal coupled to the pull-up node, and a control terminal coupled to the pull-down node;

an eleventh switching element having a first terminal coupled to the second power signal terminal, a second terminal coupled to the first node, and a control terminal coupled to the pull-down node;

a twelfth switching element having a first terminal coupled to the second power signal terminal, a second terminal coupled to the second node, and a control terminal coupled to the pull-down node; and a thirteenth switching element having a first terminal coupled to the second power signal terminal, a second terminal coupled to the first output terminal, and a control terminal coupled to the pull-down node.

19. The gate driving circuit according to claim 11, wherein the reset circuit comprises a fourteenth switching element having a first terminal coupled to the second power signal terminal, a second terminal coupled to the pull-up node, and a control terminal coupled to the reset signal terminal.

20. The gate driving circuit according to claim 11, wherein the gate driving circuit is implemented in a display device, and the first output terminal and the second output terminal in the shift register are connected to two adjacent gate lines, respectively.

* * * * *